(12) United States Patent
Pronozuk et al.

(10) Patent No.: US 9,615,480 B2
(45) Date of Patent: Apr. 4, 2017

(54) STORAGE DEVICE ASSEMBLY

(71) Applicant: Seagate Technology LLC, Cupertino, CA (US)

(72) Inventors: Anthony John Pronozuk, Loveland, CO (US); Lon Matthew Stevens, Longmont, CO (US); Andrew James Dunn, Loveland, CO (US); Shawn Jacob Noland, Longmont, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/814,268

(22) Filed: Jul. 30, 2015

(65) Prior Publication Data

US 2017/0034945 A1    Feb. 2, 2017

(51) Int. Cl.
*H05K 7/20*    (2006.01)
*H05K 7/14*    (2006.01)

(52) U.S. Cl.
CPC ......... *H05K 7/1492* (2013.01); *H05K 7/1489* (2013.01); *H05K 7/20736* (2013.01)

(58) Field of Classification Search
CPC .... H05K 7/1487; H05K 7/20; H05K 7/20136; H05K 7/20172; H05K 7/20536; H05K 7/20581; H05K 7/20709
See application file for complete search history.

(56) References Cited

U.S. PATENT DOCUMENTS

| | | | | |
|---|---|---|---|---|
| 5,381,315 A | * | 1/1995 | Hamaguchi | H05K 7/1424 312/333 |
| 6,392,892 B1 | * | 5/2002 | Sobolewski | G11B 5/584 248/634 |
| 6,693,796 B2 | | 2/2004 | Ives et al. | |
| 6,801,428 B2 | * | 10/2004 | Smith | G06F 1/181 165/80.3 |
| 6,975,510 B1 | * | 12/2005 | Robbins | H05K 7/20736 312/223.2 |
| 7,200,008 B1 | * | 4/2007 | Bhugra | G11B 25/043 361/679.21 |
| 7,867,070 B2 | | 1/2011 | Day | |
| 7,978,472 B2 | * | 7/2011 | Campbell | H05K 7/20781 165/104.33 |
| 8,054,632 B2 | * | 11/2011 | Regimbal | G06F 1/181 312/223.1 |
| 8,064,200 B1 | * | 11/2011 | West | H05K 7/20563 361/694 |

(Continued)

FOREIGN PATENT DOCUMENTS

EP    1986076 A1    10/2008

OTHER PUBLICATIONS

Author Unknown, "SGI Products," SGI, [retrieved Apr. 24, 2015] 1page. Retrieved from: https://www.sgi.com/products/.

(Continued)

*Primary Examiner* — Anthony Q Edwards
(74) *Attorney, Agent, or Firm* — Holzer Patent Drennan (57) ABSTRACT

The disclosed technology includes an open frame storage device assembly for computing equipment. The assembly is configured to vertically suspend carriers, which hold storage devices, from a rack and to interconnect the storage devices to a computer system. The disclosed assembly provides high storage capacity, low weight, efficient cooling, and centralized power.

20 Claims, 6 Drawing Sheets

(56) References Cited

U.S. PATENT DOCUMENTS

| | | | |
|---|---|---|---|
| 8,116,076 B2 | 2/2012 | Cochrane | |
| 8,351,204 B2* | 1/2013 | Yeo | G06F 1/20 |
| | | | 165/80.2 |
| 8,462,502 B2* | 6/2013 | Hirano | G06F 1/187 |
| | | | 312/223.2 |
| 2001/0004311 A1* | 6/2001 | Negishi | H05K 7/20581 |
| | | | 361/695 |
| 2002/0006026 A1* | 1/2002 | Takahashi | H05K 7/1418 |
| | | | 361/679.46 |
| 2002/0085347 A1 | 7/2002 | Erickson et al. | |
| 2004/0022045 A1* | 2/2004 | Ishida | H05K 7/1411 |
| | | | 361/802 |
| 2004/0057216 A1* | 3/2004 | Smith | G06F 1/3287 |
| | | | 361/724 |
| 2008/0180918 A1* | 7/2008 | Baker | H05K 7/20736 |
| | | | 361/727 |
| 2010/0195283 A1* | 8/2010 | Yoshimaru | H05K 7/20736 |
| | | | 361/695 |
| 2011/0007464 A1* | 1/2011 | Leigh | H01R 9/2408 |
| | | | 361/679.01 |

OTHER PUBLICATIONS

Author Unknown, "Xyratex completes acquisition of Key Assets from ARIO Data Networks," Seagate Press Release, Jan. 9, 2007, 2 pages. Retrieved from: http://www.xyratex.com/content/xyratex-completes-acquisition-key-assets-ario-data-networks.

* cited by examiner

STORAGE DEVICE ASSEMBLY

SUMMARY

According to one implementation, the disclosed technology includes an open frame storage device assembly for computing equipment. The assembly is configured to vertically suspend carriers, which hold storage devices, from a rack and to interconnect the storage devices to a computer system. The disclosed assembly provides high storage capacity, low weight, efficient cooling, and centralized power.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

DETAILED DESCRIPTIONS

As the size and capacity of storage systems increases, there is an increasing need to provide efficient and effective means for accessing and storing individual storage media within a storage enclosure assembly. A storage enclosure assembly includes racks, which house carriers containing disk drives and storage interface modules, which provide internal and external connectivity between storage media and a computing system.

The technology disclosed herein includes an open frame storage device enclosure assembly for computing equipment. The assembly is configured to vertically suspend carriers, which hold the storage devices, such as hard disk drives (HDDs) or solid state devices (SSDs), from a rack via components located on the top of each carrier and to interconnect the HDDs to a computer system. The disclosed assembly provides high storage capacity, low weight, efficient cooling, and centralized power. Specifically, the assembly can store more than 900 HDDs in carriers per rack. Once the storage devices are stored in the carrier, the carrier can be referred to as a "loaded carrier." The weight of a loaded carrier is approximately 20 lbs.

Although the following descriptions are tailored to example existing industry sizes, the example carriers can be sized to fit various dimensions in a variety of applications. The enclosure assembly can be used with a variety of HDD technologies (e.g., Ethernet HDDs, multiple HDDs sharing a single set of application-specific integrated circuits, and standard SAS/SATA, etc.).

Figure 1A:
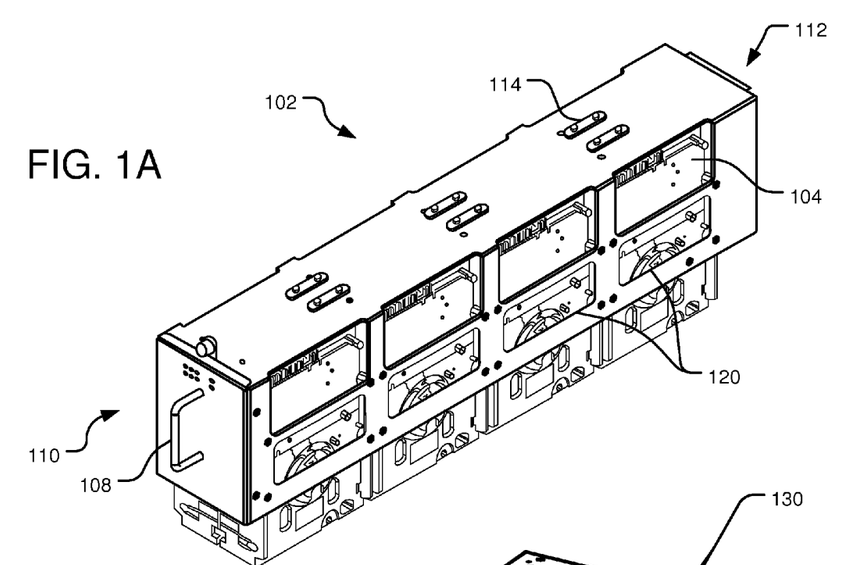
FIG. 1A illustrates a perspective view of an example carrier for the disclosed enclosure assembly.

FIG. 1A illustrates a perspective view of an example carrier 102 for the disclosed enclosure assembly. The carrier 102 shown in FIG. 1A is an eight-drive HDD carrier unit configuration. The carrier 102 has a bottom-facing opening for receiving HDDs (e.g., HDD 104). In this implementation, the carrier 102 has two rows with four HDDs (e.g., HDD 104 oriented vertically) in each row. In another implementation, a carrier is a six-drive HDD carrier unit configuration, including two rows with three HDDs in each row. In yet other implementations, a carrier unit configuration can accommodate less than six-drives or more than eight-drives.

As shown in FIG. 1A, the carrier 102 has openings 120 on the sides adjacent to each HDD 104. In this implementation, there are eight openings on each side, in addition to no enclosure on the bottom of the carrier 102. Rather than completely enclosing the HDDs 104 either individually (using many single carriers 102) or in a large grouping (which results in a heavy assembly), the open frame configuration of the carrier 102 provides for easier airflow, cooling, and access to the HDDs. In another implementation, the carrier 102 may have six openings on each side, in addition to no enclosure on the bottom of the carrier 102. In other implementations, openings may be located in other areas or configurations on the carrier 102.

Figure 1B:
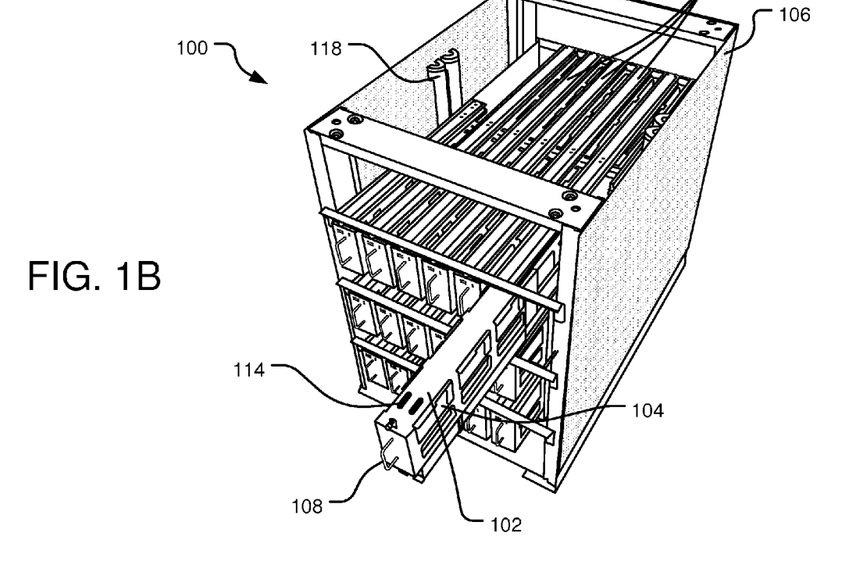
FIG. 1B illustrates a perspective view of an example enclosure assembly for the carrier of FIG. 1A.

The carrier 102 has a handle (e.g., handle 108) located at a front end 110 of the carrier 102. The handle 108 assists with loading and unloading the carrier 102 in a horizontal orientation in and out of a rack (see e.g., rack 106 in FIG. B) from a received position to an advanced position by a sliding motion. Hanging sliders (e.g., hanging sliders 114) are configured to slide into carrier holding components (e.g., rails (not shown)) in a rack, from which the carrier 102 can vertically suspend from the top of an opening in the rack (not shown). In this implementation, substantially all of the weight of the carrier 102 is transmitted to carrier holding components in the rack 106, suspending the carrier 102. Other methods of mounting the carrier 102 in the rack 106 are contemplated. Support may be provided from the top or bottom sides of the carrier. For example, instead of suspending the carrier, the carrier could be supported from the bottom. Other implementations include methods of mounting with rails with ball bearings and horizontal alignment tracks.

The vertical suspension of the carriers 102 in the rack 106 allows open side at the bottom of the carrier 102, which facilitates airflow in a bottom to top direction (or conversely, a top to bottom direction). Furthermore, having an open side at the bottom of the carriers 102 results in weight reduction at the individual HDD carrier level and at the rack level when a large number of HDDs are installed. By reducing the mounting structure of carriers 102, a bigger percentage of rack weight is designated for HDDs 104, thus increasing the storage capacity of a rack 106 without exceeding floor weight capacity limits. The disclosed assembly suspends a set of HDDs 104 from a mechanism that allows a grouping of HDDs 104 to be serviced as a group at a manageable service weight.

The carrier 102 can be loaded into the rack (see e.g., rack 106 in FIG. B) by holding the handle 108 at the front end 110 of the carrier 102, and pushing the carrier 102 into the rack with the back end 112 of the carrier 102 entering the rack 106 first. The carrier 102 can be unloaded from the rack 106 by pulling the handle 108 of the carrier 102 at the front end 110 of the carrier.

The carrier 102 and rack 106 can vary in size and in storage capacity. Examples of the sizes and the storage capacity of carriers and racks in the disclosed technology are shown in the tables below. A "U" is approximately ~1.75 inches of height. An "FRU" is a field replaceable unit.

| HDD Height | #Drives/ FRU | #FRU/4U Unit | # 4U Units/ Rack | #Drives/ Rack | Terabyte/ Drive | Petabyte/ Rack | Rack Depth |
|---|---|---|---|---|---|---|---|
| 1" | 8 | 13 | 10 | 1040 | 8 | 8.32 | 42" + Doors (45") |
| 1.625" | 8 | 9 | 10 | 720 | 20 | 14.4 | 42" + Doors (45") |

Circuitry may be disposed in one or more spaces between the carrier 102 and the rack 106. For example, a connector (not shown) may be located in the back end 112 of the carrier 102, which runs signals (e.g., for making power and data connection) to and from the HDDs 104 in the carrier 102 to a midplane (not shown) within the carrier 102 or rack 106. The midplane distributes power and signal to implement desired functionality of the HDDs. In one implementation, there can be one midplane that runs horizontally across the back ends of each row or level of carriers in a rack. In other implementations, there may be more than one midplane. For example, in an implementation where carriers can be loaded into two opposing sides of a rack, there are two midplanes per each row or level of carriers in the rack servicing each side of the carriers. In implementations where electronic circuitry is positioned between the carrier 102 and the rack 106, available space is utilized without consuming space better used for HDDs and airflow channels.

In some implementations, there may be components on the sides or bottom of the carrier 102 to attach to either a rack 106 or other structure for support. For example, the weight of the carrier 102 is supported by the vertical suspension at the top of the carrier 102 to a rack 106, however, the carrier 102 may be attached to the bottom of the rack 106 or a side or bottom rail (not shown) of the rack 106 for vibrational support or to stabilize in other environmental conditions.

FIG. 1B illustrates a perspective view of example enclosure assembly 100 for the disclosed carrier of FIG. 1A. There are three rows of carriers (e.g., carrier 102) shown, with six carriers in each row in the disclosed enclosure assembly, suspended vertically in a rack 106. The carriers 102 shown in FIG. 1B are six-drive HDD carrier unit configurations. The carriers 102 have two columns with three HDDs (e.g., HDD 104) in each column. As shown, 17 of the carriers 102 are stored and vertically suspended from the rack 106. One of the carriers 102 is partially stored.

Similar to FIG. 1A, the carriers 102 in FIG. 1B have a handle (e.g., handle 108) located at a front end 110 of the carriers 102. The handle 108 assists with loading and unloading the carrier 102 in and out of the rack 106. Hanging sliders (e.g., hanging sliders 114) are configured to slide into components in a rack, from which the carrier 102 can vertically suspend at the top of the carrier 102 from the rack 106. The carrier 102 can be loaded into the rack at the back end (shown in FIG. 1A) of the carrier 102 by holding the handle 108, and unloaded from the rack 106 by pulling the handle 108.

The example rack 106 is illustrated to include four levels of carriers 102, each level including a plurality of horizontal suspension mechanisms. For example, the rack 106 includes a plurality of horizontal suspension rails 130 that are unmovably attached to the rack 106. Such suspension rails 130 may have grooves on its bottom surface that may be used to slide the sliders 114 therein. Note that the width of the suspension plates 130 is smaller than the width of the top surface of the carrier 102. As a result, the bottom of the HDDs 104 is exposed to open space that allows airflow from the bottom of the rack 106 towards the top of the rack 106 (as further disclosed below).

In this implementation, a power rail 118 is shown configured vertically inside the rack 106, and perpendicular to the carriers 102. In other implementations, the power rail may be located in the middle of the rack 106 between the carriers 102, outside the rack 106, or in another location providing centralized power. The power rail 118 is discussed in further detail in FIG. 5.

In some implementations, as shown in FIG. 1B, the carriers 102 can be loaded into the rack 106 from two opposing sides of the rack 106. In other implementations, the carriers 102 may be loaded into only one side of the rack 106.

Figure 2:
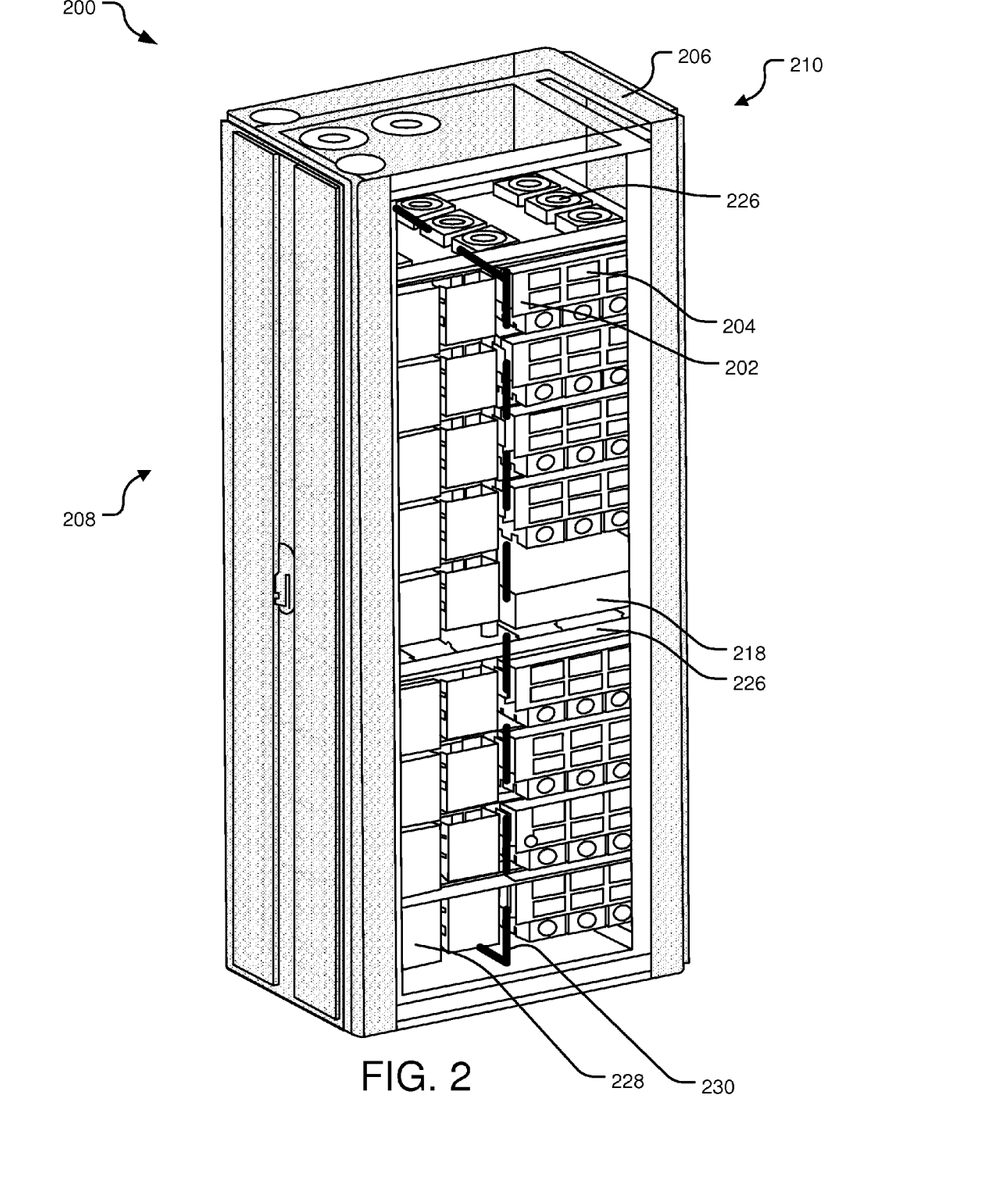
FIG. 2 illustrates a perspective isometric view of an example enclosure assembly.

FIG. 2 illustrates a perspective isometric view of an example enclosure assembly 200. There are nine levels of carriers (e.g., carrier 202) (4 U per level) in the disclosed enclosure assembly. Each carrier 202 is suspended vertically in a rack 206. The carriers 202 shown in FIG. 2 are six-drive HDD carrier unit configurations. The carriers 202 have two columns with three HDDs (e.g., HDD 204) in each column. The carriers 202 may be loaded in the rack 206 from two opposing ends, the front end 210 and the back end 208.

In this implementation, the carriers 202 with a cartridge of six HDDs 204 are vertically suspended in the rack 206 by hanging sliders (not shown) configured to slide into suspension components in the rack 206. The carrier 202 is loaded into the rack 206 at the back end 208 of the rack 206 by holding the handle (shown in FIG. 1A), and unloaded from the rack 206 using the handle. Another carrier with a cartridge of six HDDs may also be loaded into the rack 206 from a front end 210 of the rack 206. There are six carriers 202 in each level with a level on each side. A network switch (e.g., network switch 228) is connected to a midplane 230. The mid-plane 230 is located between the front and aft carriers 202. In some implementations, a network switch may be replaced with a carrier 202 in a level.

Two levels of fan systems (e.g., fans 226)(2 U per level) are located at the mid and top sections of the rack 206. An AC/DC conversion system 218, which utilizes power rails or busbars (not shown) is located inside the rack 206. The power rail can extend from the AC/DC power system 218 vertically throughout the rack 206.

Figure 3A:
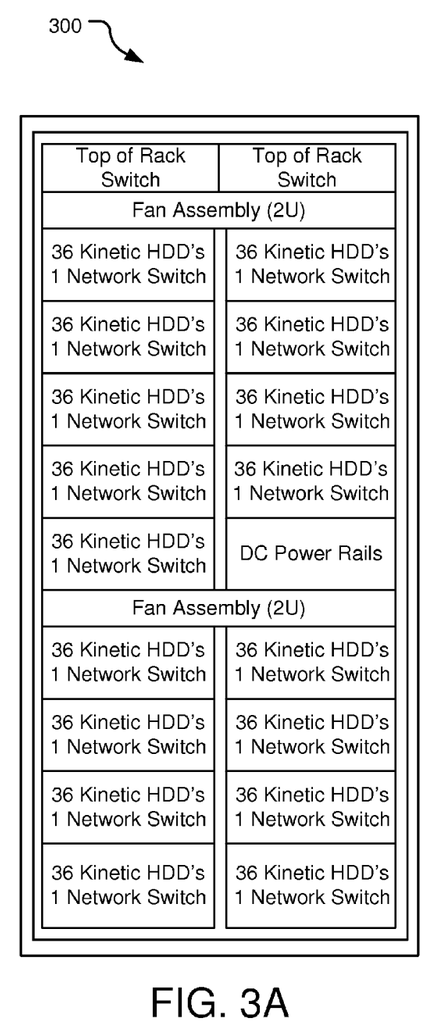
FIG. 3A illustrates a schematic side view diagram of an example rack.
Figure 3B:
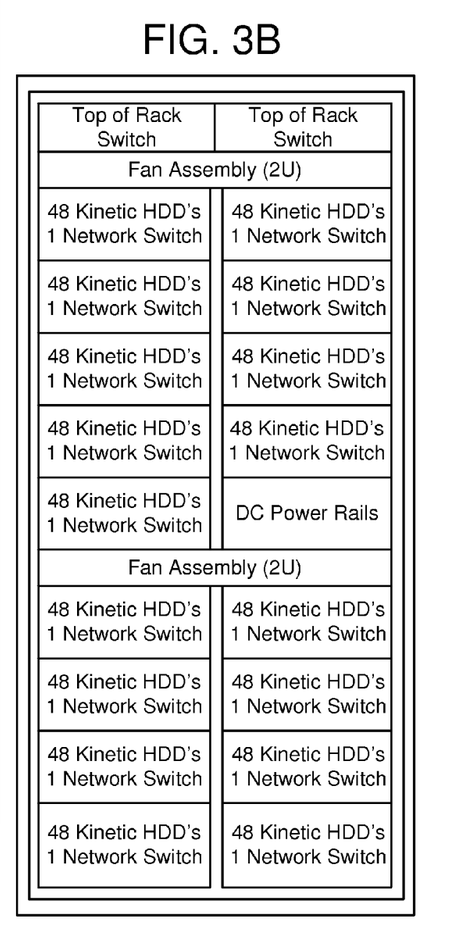
FIG. 3B illustrates a schematic side view diagram of a second example rack.
Figure 3C:
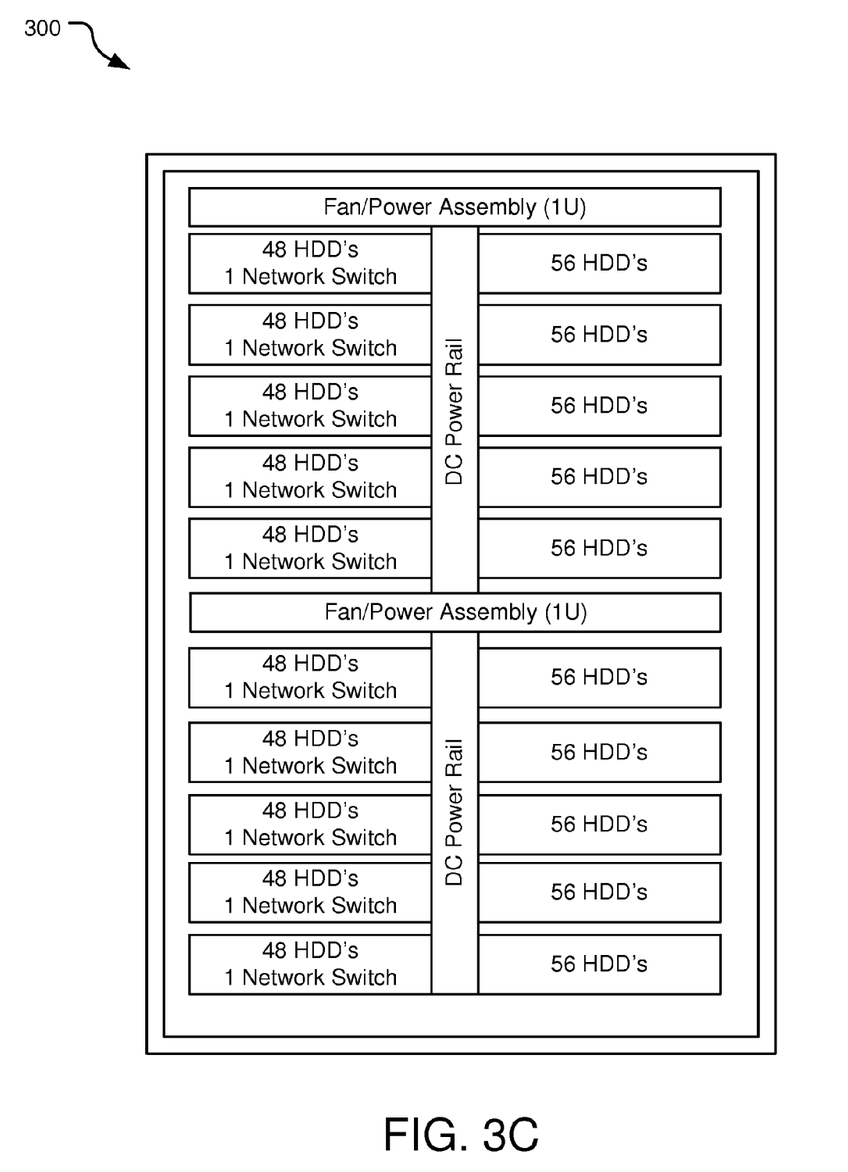
FIG. 3C illustrates a schematic side view diagram of a third example rack.

FIGS. 3A-3C illustrate schematic side view diagrams of example racks. These example racks are provided to show various implementations of the disclosed technology with regards to size, storage capacity, and component placement. Each of the example racks include vertically suspended carriers, bottom to top airflow, and centralized power supplies. Other implementations are contemplated with varying configurations.

FIG. 3A illustrates a schematic side view diagram of an example rack 300. The rack 300 accommodates 612 HDDs per rack, 2.5 PB per rack (4 TB HDDs). The HDDs are housed in separate carriers. For example, on the left side of the rack, there are nine levels, each level comprising six HDD carriers with six HDDs in each carrier for a total of 36 Ethernet HDDs and 1 Network Switch. On the right side of the rack, there are eight levels, each level comprising six HDD carriers with six HDDs in each carrier for a total of 36 Ethernet HDDs and 1 Network Switch, and an AC/DC conversion system, which utilizes power rails or busbars located near the center of the rack. The power rail can extend from the AC/DC power system vertically throughout the rack.

In some implementations, the DC power rail may be located with the fan assembly, thereby providing additional room for more HDDs. For example, in one implementation, there may be a row of power supplies next to fan modules, in an alternating order, all connected to a board. In an implementation where carriers are loaded from two opposing sides of a rack, there is a symmetrical configuration of components, with the two sets of power boards adjacent to each other in the center of the rack, per row. These power boards connect to a centralized power rail connected on the sides of the rack, the centralized power rack, which is located perpendicular to the rows of carriers.

A first fan/power assembly (2 U) is located at the top of the rack extending horizontally over the carriers of HDDs on both the front and aft sides of the rack. A second fan/power assembly (2 U) is located near the center of the rack extending horizontally between the carriers of HDDs on the front and aft sides of the rack. In this implementation, two top of rack switches (e.g., 2 U rack switch) are located on top of the rack on top of the first fan/power assembly (2 U).

FIG. 3B illustrates a schematic side view diagram of a second example rack. The rack 300 accommodates 816 HDDs per rack, 3.2 PB per rack (4 TB HDDs). The HDDs are housed in separate carriers. For example, on the left side of the rack, there are nine levels, each level comprising six HDD carriers with eight HDDs in each carrier for a total of 48 Ethernet HDDs and 1 Network Switch in the seventh carrier. On the right side of the rack, there are eight levels, each level comprising six HDD carriers with eight HDDs in each carrier for a total of 48 Ethernet HDDs and 1 Network Switch in the seventh carrier, and a DC Power Rail located near the center of the rack.

In some implementations, the DC power rail may be located with the fan assembly, thereby providing additional room for more HDDs. For example, in one implementation, there may be a row of power supplies next to fan modules, in an alternating order, all connected to a power board. In an implementation where carriers are loaded from two opposing sides of a rack, there is a symmetrical configuration of components, with the two sets of power boards adjacent to each other in the center of the rack, per row. These power boards connect to a centralized power rail connected on the sides of the rack, the centralized power rack, which is located perpendicular to the rows of carriers.

A first fan/power assembly (2 U) is located at the top of the rack extending horizontally over the carriers of HDDs on both the front and aft sides of the rack. A second fan/power assembly (2 U) is located near the center of the rack extending horizontally between the carriers of HDDs on the front and aft sides of the rack.

The fan/power assemblies can be located at the top of the racks and about midway up the racks, or other configurations are contemplated. In order to manage pressure and temperature, the airflow is managed in different directions (as described in more detail in FIG. 4). In some implementations, the racks have grills or side openings to assist the two fan locations in airflow. In the implementation, two top of rack switches (2 U) are located on top of the rack on top of the first fan/power assembly (2 U).

FIG. 3C illustrates a schematic side view diagram of a third example rack. The rack 300 is 42 U and accommodates 1040 HDDs. The HDDs are housed in separate carriers. For example, on the front (or back) side of the rack, there are ten levels, each level comprising six HDD carriers with eight HDDs in each carrier for a total of 48 HDDs and 1 Network Switch in the seventh carrier. On the back (or front) side of the rack, there are ten levels, each level comprising seven HDD carriers with eight HDDs in each carrier for a total of 56 HDDs. DC power rail(s) run from the bottom to the top sides of the rack. The DC power supplies are integrated with the fan modules in the same row in an alternating order with all connected to a board.

In an implementation where carriers are loaded from two opposing sides of a rack, there is a symmetrical configuration of components, with the two sets of power boards adjacent to each other in the center of the rack, per row. These power boards connect to a centralized power rail connected on the sides of the rack, the centralized power rack, which is located perpendicular to the rows of carriers.

A first fan/power assembly (1 U) is located at the top of the rack extending horizontally over the carriers of HDDs on both the front and aft sides of the rack. A second fan/power assembly (1 U) is located near the center of the rack extending horizontally between the carriers of HDDs. One DC power rail is located in the center of the rack. In this implementation, an out of rack top of rack switch is located on top of the rack.

Figure 4:
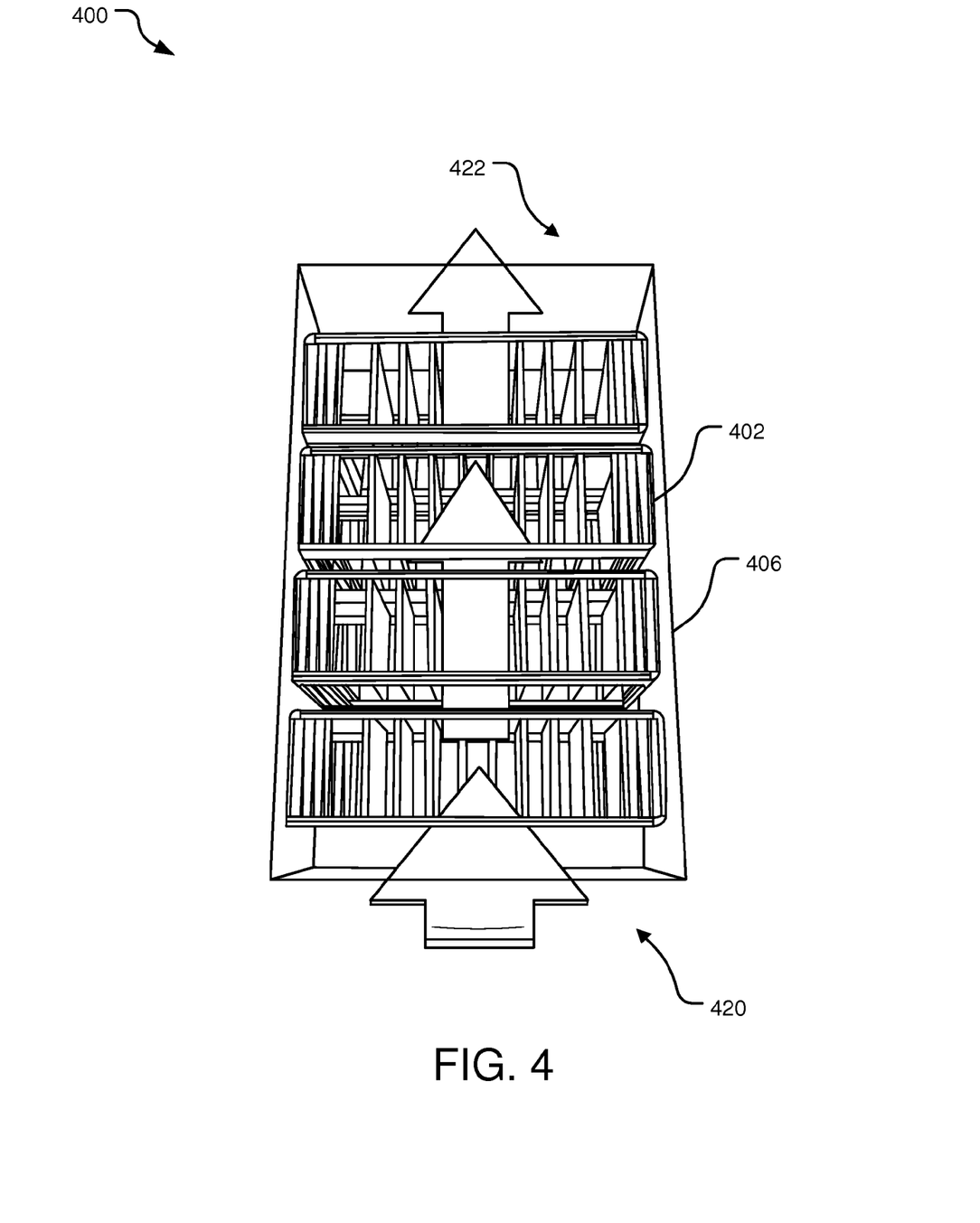
FIG. 4 illustrates an example diagram of airflow in the disclosed enclosure assembly.

FIG. 4 illustrates an example diagram of airflow in the disclosed enclosure assembly 400. As the demand for space to store larger amounts of data increase, the capacities of data storage media and the densities with which that are packed within a data storage system increase. The increase in capacities and densities means that the power consumption of a data storage system and the amount of heat generated within the system increase. It is necessary to ensure that adequate cooling is provided to the HDDs (not shown) to prevent overheating. This is implemented by providing a cooling airflow through the carrier 402, which cools HDDs and/or other components of the carrier 402.

The carriers in the racks in the disclosed technology are arranged in stacks in a horizontal direction and in arrays in a vertical plane within the carriers (e.g., carrier 402) to allow adequate airflow between HDDs. The HDDs are arranged so that air can travel through and between the stacks. Airflow generating means are provided within the rack enclosure to generate vertical bottom to top airflow so that, when in operation, the HDDs are cooled by the passing airflow.

As shown, the rack 406 allows air to flow through the enclosure assembly 400 from a bottom end 420 of the rack 406 to a top end 422 of the rack 406. This arrangement leaves narrow air gaps between the HDDs and a high packing density of HDDs in the carrier 402, yet provides adequate airflow to cool the HDDs.

In many data centers (or configurations), hardware is cooled in a front to back direction airflow. For example, in one implementation in a data center, a "cool" aisle or walkway adjacent to one side of an enclosure assembly can act as a cool air inlet, and an opposing "warm" aisle or walkway on the other side of the enclosure assembly acts as a warm air outlet. The disclosed technology eliminates the need for any cold or warm aisles, which alleviates users (e.g., data center employees) and facilities of temperature extremes during service events as they can be shunted directly into an HVAC system.

Bottom to top direction airflow requires fewer fans located in each chassis or rack, which is advantageous for space, cost, and efficiency reasons, as well as noise reduction. The bottom to top direction airflow also is beneficial with redundancy, space, and takes advantage of the natural convection of heat rising. In some implementations of the disclosed technology, heat could be directed up and out of a facility.

Fans (not shown) can be located near the top end 422 of a rack 406 and about midway up rack 406, although other configurations are contemplated. In order to manage pressure and temperature, the airflow is managed in different directions. In some implementations, the rack 406 has grills or side openings to assist the fan locations in airflow.

Figure 5:
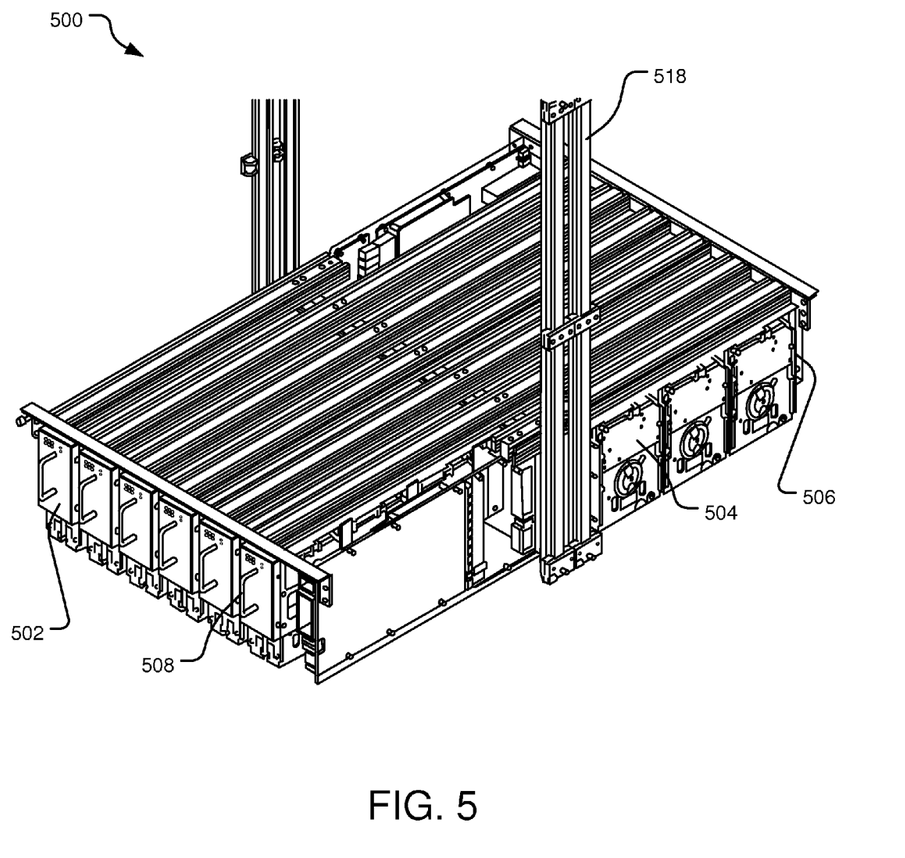
FIG. 5 illustrates an example perspective view of an example enclosure assembly with a centralized power system.

FIG. 5 illustrates an example enclosure assembly 500 with a centralized DC power distribution system. Rather than providing AC/DC power conversion individually at each server, the disclosed technology includes centralized rack power distribution. By centralizing AC/DC power conversion for the rack it is possible to reduce cost, save space, and reduce weight. Centralized AC/DC power conversion allows for fewer power supplies per rack to be used (e.g., 12 power supplies/rack).

As shown in FIG. 5, there is an enclosure assembly 500 that includes a power rail 518 that distributes power to every unit (e.g., HDD 504) carriers (e.g., carrier 502) in a rack 506. The power rail 518 is positioned perpendicular to carriers 502 in the rack 506. The power rail 518 can be located outside or inside the rack. For example, it may be located outside on each side of the rack 506 or in the center of the rack 506.

The carriers 502 are loaded into the rack and have handles (e.g., handle 508) to load and unload the carriers from the rack 506. Once loaded, connectors on the carriers 502 carry power to, and/or data signals from, the HDDs to a mid-plane board providing a convenient way of connecting HDDs to the rest of the enclosure assembly 500.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet other embodiments without departing from the recited claims.

What is claimed is:

1. An assembly comprising:
    a rack;
    at least one carrier configured to vertically suspend from the rack; and
    at least one storage device configured to vertically suspend from the at least one carrier, the at least one storage device directly attached to the carrier.

2. The assembly of claim 1, wherein the at least one carrier is configured to have an open bottom side.

3. The assembly of claim 1, wherein the at least one storage device is a non-volatile digital storage device.

4. The assembly of claim 1, wherein the rack further comprises one centralized power rail configured to provide power to the at least one storage device.

5. The assembly of claim 1, wherein the rack further comprises fan assemblies configured to direct airflow in a bottom to top direction within the storage enclosure assembly.

6. The assembly of claim 5, where the fan assemblies are located at the top of the rack and about midway up the rack.

7. The assembly of claim 3, where the at least one carrier holds at least six HDDs.

8. The assembly of claim 7, wherein the weight of a loaded carrier is less than 20 lbs.

9. The assembly of claim 1, further comprising hanging sliders located on the top of the at least one carrier configured to slide into a suspension mechanism of the rack for vertical suspension.

10. An apparatus, comprising:
    a rack configured to direct airflow in a bottom to top direction; and
    a carrier vertically suspending from the rack, the carrier configured to directly hold storage devices and configured to provide internal and external connectivity between storage media and a computing system said storage devices configured to vertically suspend from said carrier.

11. The apparatus of claim 10, wherein the weight of a loaded carrier is less than 20 lbs.

12. The apparatus of claim 10, further comprising hanging sliders located on the top of the carrier configured to slide into a suspension mechanism of the rack for vertical suspension.

13. A system comprising:
    a rack configured to vertically suspend a storage carrier from the top of the storage carrier, the storage carrier configured to vertically suspend house a plurality of storage devices.

14. The system of claim 13, further comprising rails located in the rack configured to accept hanging sliders located on top of the storage carrier for vertical suspension.

15. The system of claim 13, wherein the storage carrier is configured to have an open bottom side.

16. The system of claim 13, wherein the rack further comprises one centralized power rail configured to provide power to the storage devices.

17. The system of claim 13, wherein the rack further comprises fan assemblies configured to direct airflow in a bottom to top direction within the system.

18. The system of claim 17, wherein the fan assemblies are located at the top of the rack and about midway up the rack.

19. The system of claim 13, where the storage carrier holds at least six hard disk drives.

20. The system of claim 13, wherein the plurality of storage devices are hard disk drives or solid state devices.

* * * * *